United States Patent
Tjandra et al.

(10) Patent No.: US 9,123,758 B2
(45) Date of Patent: Sep. 1, 2015

(54) GAS INJECTION APPARATUS AND SUBSTRATE PROCESS CHAMBER INCORPORATING SAME

(71) Applicant: APPLIED MATERIALS, INC., Santa Clara, CA (US)

(72) Inventors: Agus Sofian Tjandra, San Jose, CA (US); Kalyanjit Ghosh, San Jose, CA (US); Christopher S. Olsen, Fremont, CA (US); Umesh M. Kelkar, Santa Clara, CA (US)

(73) Assignee: APPLIED MATERIALS, INC., Santa Clara, CA (US)

( * ) Notice: Subject to any disclaimer, the term of this patent is extended or adjusted under 35 U.S.C. 154(b) by 0 days.

(21) Appl. No.: 14/154,346

(22) Filed: Jan. 14, 2014

(65) Prior Publication Data

US 2014/0216585 A1    Aug. 7, 2014

Related U.S. Application Data

(60) Provisional application No. 61/761,376, filed on Feb. 6, 2013.

(51) Int. Cl.
*F15C 1/16* (2006.01)
*H01L 21/67* (2006.01)

(52) U.S. Cl.
CPC .... *H01L 21/67115* (2013.01); *H01L 21/67017* (2013.01); *H01L 21/6719* (2013.01); *Y10T 137/87652* (2015.04)

(58) Field of Classification Search
CPC .............. C23C 16/4412; C23C 16/455; C23C 16/45565; C30B 25/14; F15C 1/16; H01L 21/67115; H01L 21/67017; H01L 21/6719; Y10T 137/87652
USPC .............. 137/808, 896, 561 A; 118/715, 641; 156/345.33, 345.34, 345.38; 438/680
See application file for complete search history.

(56) References Cited

U.S. PATENT DOCUMENTS

| 8,056,500 B2 | 11/2011 | Tseng et al. |
| 2001/0042512 A1* | 11/2001 | Xu et al. .................... 118/723 R |
| 2001/0042742 A1* | 11/2001 | Li ................................. 219/390 |

(Continued)

OTHER PUBLICATIONS

International Search Report and Written Opinion mailed May 19, 2014 for PCT Application No. PCT/US2014/011462.

*Primary Examiner* — Craig Schneider
*Assistant Examiner* — Minh Le
(74) *Attorney, Agent, or Firm* — Moser Taboada; Alan Taboada

(57) ABSTRACT

Methods and apparatus for mixing and delivery of process gases are provided herein. In some embodiments, a gas injection apparatus includes an elongate top plenum comprising a first gas inlet; an elongate bottom plenum disposed beneath and supporting the top plenum, the bottom plenum comprising a second gas inlet; a plurality of first conduits disposed through the bottom plenum and having first ends fluidly coupled to the top plenum and second ends disposed beneath the bottom plenum; and a plurality of second conduits having first ends fluidly coupled to the bottom plenum and second ends disposed beneath the bottom plenum; wherein a lower end of the bottom plenum is adapted to fluidly couple the gas injection apparatus to a mixing chamber such that the second ends of the plurality of first conduits and the second ends of the plurality of second conduits are in fluid communication with the mixing chamber.

18 Claims, 5 Drawing Sheets

(56) References Cited

U.S. PATENT DOCUMENTS

| | | |
|---|---|---|
| 2002/0017243 A1* | 2/2002 | Pyo ................................ 118/715 |
| 2004/0050328 A1* | 3/2004 | Kumagai et al. .............. 118/715 |
| 2005/0118737 A1* | 6/2005 | Takagi et al. .................... 438/14 |
| 2006/0162661 A1 | 7/2006 | Jung et al. |
| 2007/0148349 A1* | 6/2007 | Fukada ...................... 427/248.1 |
| 2009/0011578 A1* | 1/2009 | Samoilov et al. ............. 438/494 |
| 2009/0104351 A1* | 4/2009 | Kakegawa ................. 427/248.1 |
| 2009/0211707 A1* | 8/2009 | Chao et al. ................ 156/345.34 |
| 2010/0136216 A1 | 6/2010 | Tsuei et al. |
| 2011/0005681 A1 | 1/2011 | Savas et al. |
| 2011/0027480 A1* | 2/2011 | Han ........................... 427/248.1 |
| 2011/0256692 A1 | 10/2011 | Tam et al. |
| 2011/0256729 A1* | 10/2011 | Goodlin et al. ............... 438/758 |
| 2012/0258602 A1 | 10/2012 | Subramani et al. |

\* cited by examiner

GAS INJECTION APPARATUS AND SUBSTRATE PROCESS CHAMBER INCORPORATING SAME

CROSS-REFERENCE TO RELATED APPLICATIONS

This application claims benefit of U.S. provisional patent application Ser. No. 61/761,376, filed Feb. 6, 2013, which is herein incorporated by reference.

FIELD

Embodiments of the present invention generally relate to methods and apparatus for gas injection for semiconductor processing equipment.

BACKGROUND

Rapid thermal processing (RTP) subjects a substrate to brief intense bursts of heat. RTP technology can be used to change the characteristics of a deposited film or crystal lattice and generally includes processing such as annealing, silicidation, and oxidation of a substrate surface.

Generally, an RTP chamber includes a radiant heat source, a chamber body, a substrate support, and a process gas supply system. The radiant heat source is typically mounted on a top surface of the chamber body so that the energy generated by the heat source radiates upon the substrate supported by the substrate support within the chamber body. Processing gases are usually supplied to the chamber from one or more gas inlets. When two process gases are used, for example hydrogen ($H_2$) and oxygen ($O_2$), they are typically introduced to the chamber from separate gas inlets or they may be premixed before being delivered to the process chamber through a single inlet.

The inventors have observed that process gases provided from separate gas inlets often provides suboptimal gas mixing which adversely affects process uniformity. For example, the mixing point of the gases may be on the substrate, forming a non-uniform gas composition across the substrate. Furthermore, even where the substrate is rotated, the rotational speed and direction of the substrate adversely affects the uniformity of the mixed gases, further contributing to process non-uniformities.

On the other hand, the inventors have also observed that premixing process gases prior to delivery to the chamber is problematic due to back flaming or flashback which can cause damage to components of the gas supply system. Flashback is a condition in which the flame velocity is opposite in direction and greater in magnitude than the process gas velocity and may extend to the mixing point of the gases. The velocity of premixed process gases is often not great enough to maintain stable combustion of the gas in the chamber.

Accordingly, the inventors have provided improved apparatus and methods for the mixing and delivery of process gases.

SUMMARY

Methods and apparatus for mixing and delivery of process gases are provided herein. In some embodiments, a gas injection apparatus includes an elongate top plenum comprising a first gas inlet; an elongate bottom plenum disposed beneath and supporting the top plenum, the bottom plenum comprising a second gas inlet; a plurality of first conduits disposed through the bottom plenum and having first ends fluidly coupled to the top plenum and second ends disposed beneath the bottom plenum; and a plurality of second conduits having first ends fluidly coupled to the bottom plenum and second ends disposed beneath the bottom plenum; wherein a lower end of the bottom plenum is adapted to fluidly couple the gas injection apparatus to a mixing chamber such that the second ends of the plurality of first conduits and the second ends of the plurality of second conduits are in fluid communication with the mixing chamber.

In some embodiments, a gas injection apparatus includes an elongate top plenum having a vortex generator and a pair of opposing first gas inlets, wherein the vortex generator comprises a constricted volume area in an upper portion of the top plenum, and wherein the opposing first gas inlets are disposed in upper portions of opposing sides of the top plenum within the constricted volume area; an elongate bottom plenum disposed beneath and supporting the top plenum, the elongate bottom plenum having a vortex generator and a pair of opposing second gas inlets, wherein the vortex generator comprises a constricted volume area in an upper portion of the bottom plenum, and wherein the opposing second gas inlets are disposed in upper portions of opposing sides of the bottom plenum within the constricted volume area; a plurality of first conduits disposed through the bottom plenum and having first ends fluidly coupled to the top plenum and second ends disposed beneath the bottom plenum; and a plurality of second conduits having first ends fluidly coupled to the bottom plenum and second ends disposed beneath the bottom plenum.

In some embodiments, a substrate processing apparatus comprises a process chamber having an inner volume; a gas injection apparatus as described in any of the embodiments disclosed herein coupled to the chamber body; wherein the gas injection apparatus is coupled to the chamber body adjacent to the substrate tunnel such that the mixing chamber of the gas injection apparatus is the substrate tunnel.

Other and further embodiments of the present invention are described below.

BRIEF DESCRIPTION OF THE DRAWINGS

Embodiments of the present invention, briefly summarized above and discussed in greater detail below, can be understood by reference to the illustrative embodiments of the invention depicted in the appended drawings. It is to be noted, however, that the appended drawings illustrate only typical embodiments of this invention and are therefore not to be considered limiting of its scope, for the invention may admit to other equally effective embodiments.

Figure 1:
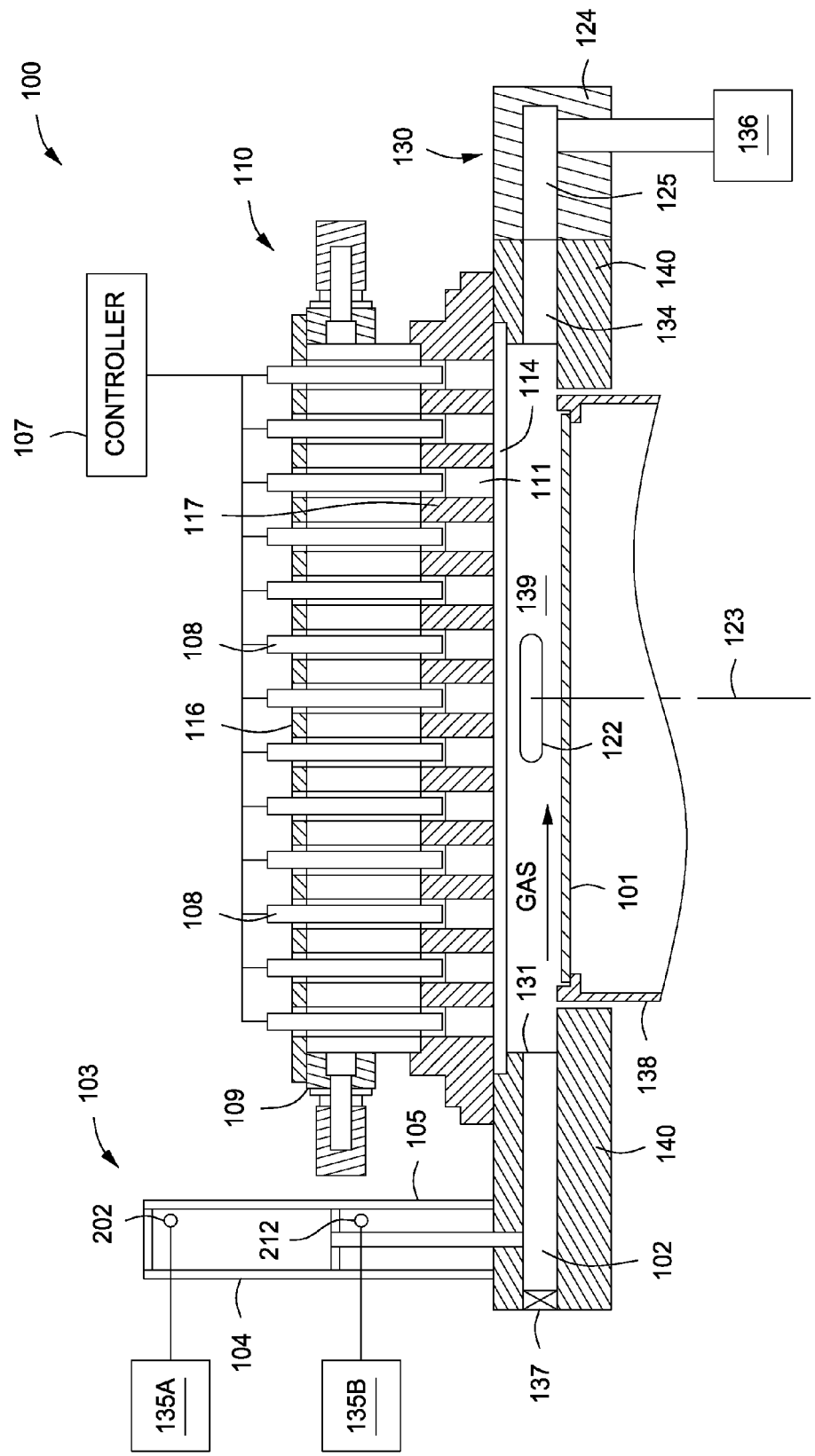
FIG. 1 depicts a schematic sectional side view of a thermal reactor in accordance with an embodiment of the present invention.

To facilitate understanding, identical reference numerals have been used, where possible, to designate identical elements that are common to the figures. The figures are not drawn to scale and may be simplified for clarity. It is contemplated that elements and features of one embodiment may be beneficially incorporated in other embodiments without further recitation.

DETAILED DESCRIPTION

Methods and apparatus that may provide one or more of improved mixing of process gases and delivery of process gases to a process chamber are provided herein. Embodiments of the inventive methods and apparatus may advantageously allow a broader range of gas concentrations to be used in chambers with reduced flashback.

While not intended to be a limitation to the scope of the invention, embodiments of the inventive apparatus and methods disclosed herein may be particularly advantageous in process chambers configured for rapid thermal processing (RTP).

FIG. 1 is a schematic sectional side view of a thermal processing chamber 100 in accordance with one embodiment of the present invention. The thermal processing chamber 100 generally comprises a lamp assembly 110, a chamber assembly 130 defining a processing volume 139, and a substrate support 138 disposed in the processing volume 139.

The lamp assembly 110 is positioned above the chamber assembly 130 and is configured to supply heat to the processing volume 139 via a quartz window 114 disposed on the chamber assembly 130. The lamp assembly 110 is configured to house a radiant energy source 108, such as a plurality of tungsten-halogen lamps for providing a tailored infrared heating means to a substrate 101 disposed on a substrate support surface of the substrate support 138.

The lamp assembly 110 generally comprises a plurality of light pipes 111 which may be made of stainless steel, brass, aluminum or other metal. Each of the light pipes 111 is configured to house a radiant energy source 108 to provide heat to the processing volume 139 in the form of infrared radiation. The ends of the light pipes 111 are brazed or welded to openings in an upper cooling wall 116 and a lower cooling wall 117.

Coolant may be circulated to the lamp assembly 110 through an inlet 109 to keep the lamp assembly 110 cool during processing. Each of the radiant energy sources 108 may be connected to a controller 107 which may control the energy level of each radiant energy source 108 to achieve a uniform or tailored heating profile to the processing volume 139.

The chamber assembly 130 generally comprises a base 140 which, with the quartz window 114 and a bottom wall (not shown), defines the processing volume 139.

The base 140 may have an inlet 131 fluidly coupling a mixing chamber 102 with the processing volume 139 and configured to provide processing gases to the processing volume 139.

The mixing chamber 102 is fluidly coupled to a gas injection apparatus 103 comprising a top plenum 104 and a bottom plenum 105. The gas injection apparatus is an elongate structure disposed on a side of the thermal processing chamber 100. The top plenum 104 is elongate and includes a first gas inlet 202 that may be fluidly coupled to a first gas source 135a. Similarly, the bottom plenum is elongate and includes a second gas inlet 212 which may be fluidly coupled to a second gas source 135b. In some embodiments, the the first gas source provides one of an oxygen gas ($O_2$) or a hydrogen gas ($H_2$), and the second gas source provides the other of the oxygen gas ($O_2$) or the hydrogen gas ($H_2$). The inventors have discovered that the separation of the hydrogen gas ($H_2$) and oxygen gas ($O_2$) and delivery using the gas injection apparatus as described herein advantageously limits combustion to inside the mixing tunnel and the process chamber after the gases mix.

An outlet 134, formed on an opposite side of the base 140 from the inlet 131, is couple to an exhaust assembly 124 which is in fluid communication with a pump system 136. The exhaust assembly 124 defines an exhaust volume 125, which is in fluid communication with the processing volume 139 via the outlet 134. The exhaust volume 125 is designed to allow uniform gas flow distribution across the processing volume 139.

In some embodiments, the mixing chamber 102 may be an inlet or substrate tunnel for a robot to drop/retrieve the substrate 101 on/from the substrate support 138 positioned in the processing volume 139. A valve 137, for example a slit valve, may be coupled to the inlet 131 to selectively isolate the processing volume 139 from the surrounding environment. The substrate support 138 may be configured to move vertically and to rotate about a central axis 123.

In some embodiments, the base 140 may have one or more side ports 122 formed on sides of the base 140 between the inlet 131 and the outlet 134. The side ports 122 may be connected to a gas source configured to improve gas distribution uniformity near edge areas of the substrate 101.

Figure 2:
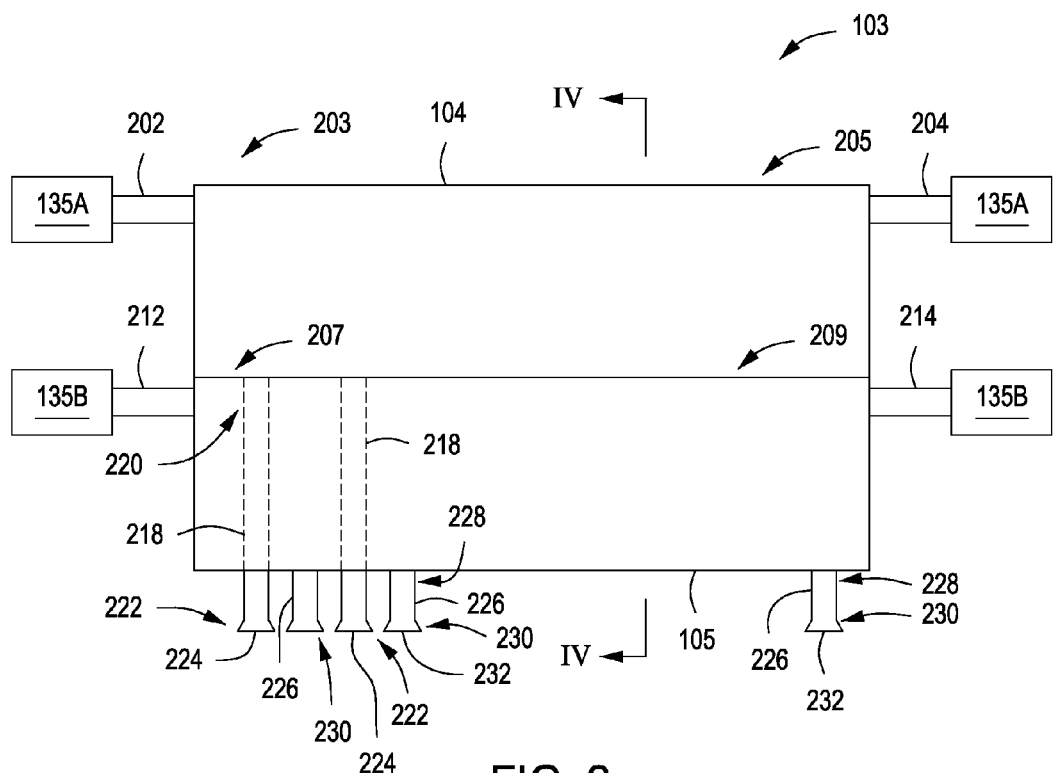
FIG. 2 depicts a side view of a gas injection apparatus in accordance with some embodiments of the present invention.

FIG. 2 depicts a side view of a gas injection apparatus 103 in accordance with some embodiments of the present invention. The gas injection apparatus 103 includes a top plenum 104 and a bottom plenum 105 disposed beneath and supporting the top plenum 104. The top plenum 104 and bottom plenum 105 are fluidly isolated from one another within the gas injection apparatus 103. The dual plenum (or chamber) design advantageously facilitates injection of two gases independently, and therefore may provide better control of the velocity and amount of the individual gases provided.

Figure 3:
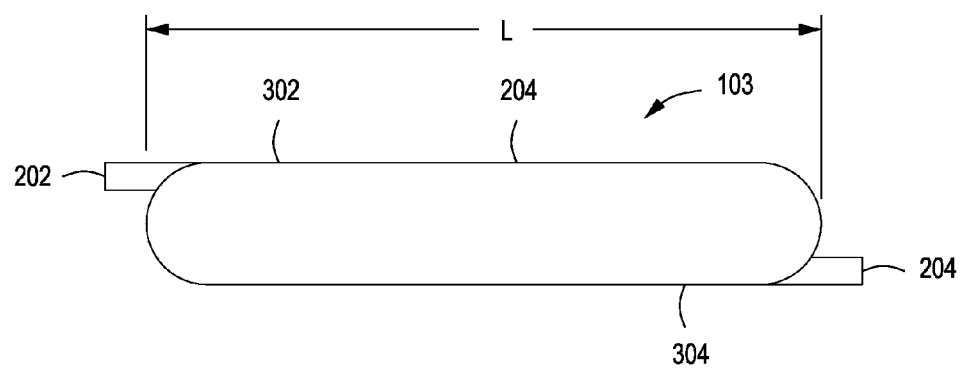
FIG. 3 depicts a top view of the gas injection apparatus of FIG. 2.

The top plenum 104 includes a first gas inlet 202 fluidly coupled at an upper portion of a first end 203 of the top plenum 104 to supply a first gas from the first gas source 135a. In some embodiments, the top plenum 104 may also include an opposing first gas inlet 204 at an upper portion of a second end 205 also fluidly coupled to the first gas source 135a. In some embodiments, the first gas inlet 202 may be located at a first side 302 of the gas injection apparatus 103 and the opposing first gas inlet 204 may be located at an opposite second side 304 of the gas injection apparatus 103 as illustrated in FIG. 3.

The bottom plenum 105 includes a second gas inlet 212 fluidly coupled at an upper portion of a first end 207 of the bottom plenum 105 to supply a second gas from the second gas source 135b. In some embodiments, the bottom plenum 105 may also include an opposing second gas inlet 214 at an upper portion of a second end 209 of the bottom plenum 105 also fluidly coupled to second gas source 135b. In some embodiments, the second gas inlet 212 may be located at a first side 302 of the gas injection apparatus 103 and the opposing second gas inlet 214 may be located at an opposite second side 304 of the gas injection apparatus 103.

In some embodiments, a plurality of first conduits 218 have first ends 220 fluidly coupled to the top plenum 104. First conduit 218 second ends 222 may be disposed below the lower end of the bottom plenum 105. The second ends 222 may terminate at a first nozzle 224.

A plurality of second conduits 226 have first ends 228 fluidly coupled to the bottom plenum 105. Second ends 230 of the second conduits may be disposed below the lower end of the bottom plenum 105. The second ends 230 may terminate at a second nozzle 232. The first nozzle 224 and the second nozzle 232 may be configured to selectively dispense a first gas from the top plenum 104 and a second gas from the bottom plenum 105, respectively.

Any number of first conduits 218 may be used with any number of second conduits 226. The inventors have achieved favorable results using a total of 75 nozzles, although a lesser number, or a greater number, may be used. The first and second nozzles 224, 232 are illustrated in an alternating pattern of one first nozzle 224 and one second nozzle 232 for ease of illustration only. Any pattern of first and second nozzles may be used to achieve the desired gas injection characteristics, such as flow and composition. The inventors have discovered that the nozzles can be configured to advantageously provide a gas velocity that is greater than a flashback velocity of the mixed hydrogen gas ($H_2$) and oxygen gas ($O_2$) when combusted, advantageously preventing slit valve o-ring burn or gas line overheating as may occur in other systems. In addition, the velocity of the process gases can be advantageously controlled to be great enough to maintain stable combustion of the gas in the chamber.

Figures 4, 4A:
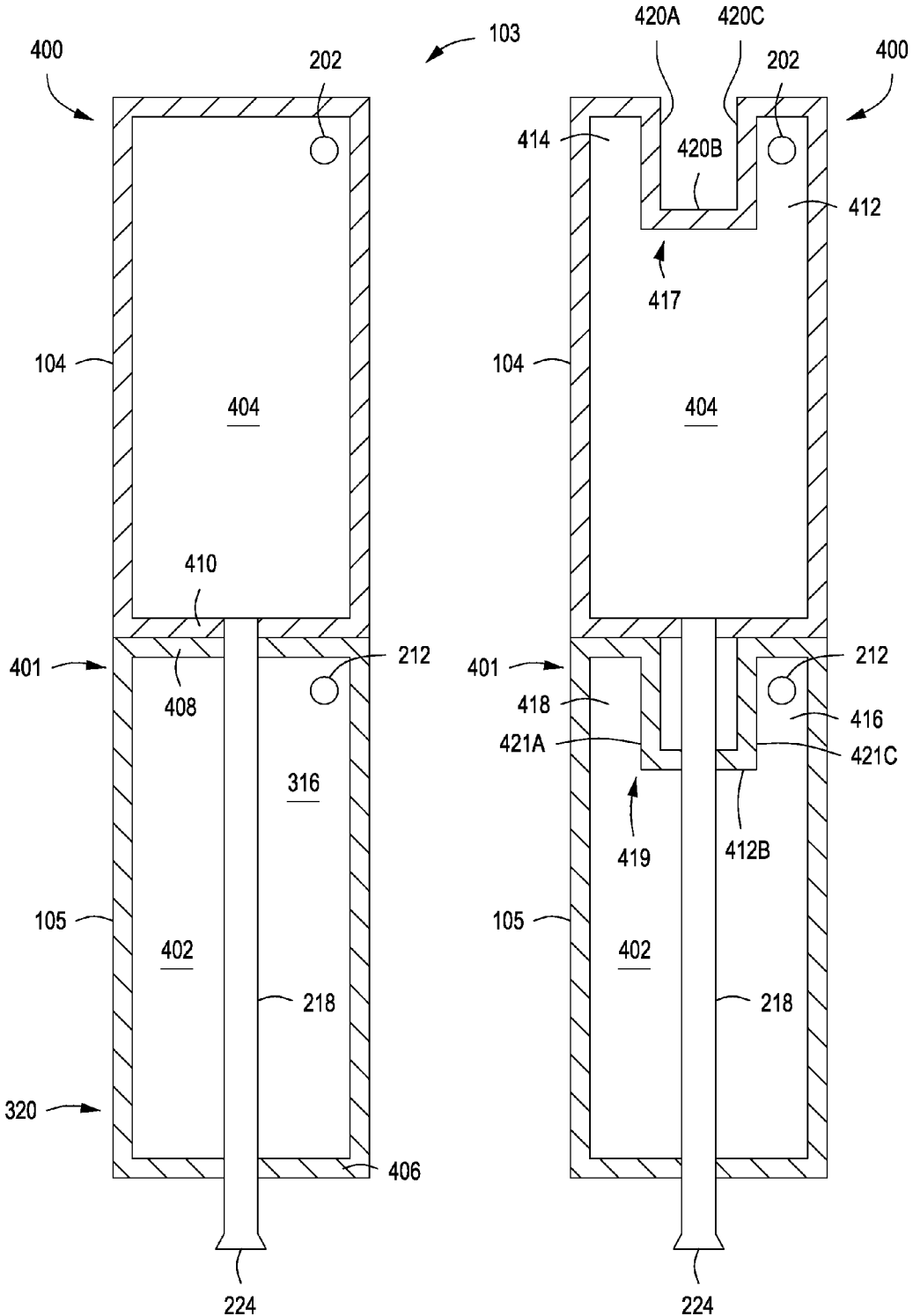
FIG. 4 depicts a cross sectional view of a gas injection apparatus in accordance with some embodiments of the present invention taken along line IV-IV of FIG. 2.
FIG. 4A depicts a cross sectional view of a gas injection apparatus in accordance with some embodiments of the present invention taken along line IV-IV of FIG. 2.

As illustrated in FIG. 4, second conduit 226 penetrates the bottom plenum wall 406 and establishes fluid communication with the interior volume 402.

In the non-limiting embodiment of FIG. 4, first conduit 218 penetrates bottom plenum walls 406 and 408, passing through interior volume 402, and penetrates the top plenum wall 410 establishing fluid communication with the interior volume 404. Interior volumes 402 and 404 are isolated from each other within the gas distribution apparatus by a plenum separator, which may comprise one or more plenum walls, for example, bottom plenum wall 408 and top plenum wall 410. Alternately, or in addition, a plenum separator may include a separate element (not shown) placed between the top plenum 104 and the bottom plenum 105.

In the non-limiting embodiment of FIG. 4, a first end of the first gas inlet 202 is fluidly coupled with the top plenum 104 at an upper portion 400 of the first end 203. The first gas inlet 202 may enter the top plenum 104 at any convenient location that facilitates desirable distribution of the gas within the interior volume 404. The first gas inlet 202 may be fluidly coupled at an opposite end to first gas source 135a to supply a first gas to the interior volume 404.

In some embodiments, a first end of an opposing first gas inlet 204 may be fluidly coupled with the top plenum at second end 205 similar to the above. The second end of the opposing first gas inlet 204 may be connected to the first gas source 135a.

In some embodiments, and as depicted in FIG. 4A, the top and the bottom plenums include vortex generators 417 and 419, respectively. With reference to the top plenum 104, first gas inlet 202 is fluidly coupled with the top plenum 104 at an upper portion 400 of the first end 203. The upper portion 400 may be configured such that the first gas inlet 202 enters into a constricted volume area, such as constricted volume area 412 constricted by one or more wall segments 420a-c. The wall segments 420A-C may be of any configuration and may extend along at least a portion or portions of the length L between first end 203 and second end 205. The wall segments 420A-C may be continuous or discontinuous along the length L. In some embodiments, the wall segments 420A-C are continuous along the entire length L and are centered such that an equal gap exists between the wall segments 420A-C and the inner sidewalls of the top plenum 104.

The second end 205 of the top plenum may be constructed similar to the first end and may include at least a portion of one or more wall segments 420a-c as above. Accordingly, the opposing first gas inlet 204 may enter the top plenum at constricted volume area 414 at the second end 205. In some embodiments, it may be desirable to have first gas inlet 202 and opposing first gas inlet 204 enter the top plenum in the same constricted volume area, for example constricted volume area 412.

In the non-limiting embodiment illustrated, the first gas flows through first gas inlet 202 into constricted volume area 412. The first gas also flows through the opposing first gas inlet 204 into the constricted volume area 414. The constricted volume areas are in fluid communication with the larger interior volume 404. As the incoming gas flows from the constricted volume areas 412 and 414 to the interior volume 404, the expansion of the gas and the oppositely directed first gas inlets 202 and 204 develop a flow pattern that can facilitate formation of a vortex in the first gas.

In a similar fashion, the bottom plenum 105 may include a vortex generator 419. With reference to the bottom plenum 105, second gas inlet 212 is fluidly coupled with an upper portion 401 of the bottom plenum 105 at the first end 207. The upper portion 401 may be configured similar to the upper portion 400 as discussed above such that the second gas inlet 212 enters the bottom plenum 105 in a constricted volume area 416, constricted by wall segments 421A-C. The second end 209 of the bottom plenum may be constructed similar to the first end 207 as described above, with opposing second gas inlet 214 entering the bottom plenum 105 in constricted volume area 418. Accordingly, the expansion of the gas flowing from the constricted volume areas 416, 418 into the larger interior volume 402 and from the oppositely directed second gas inlets 212 and 214 develop a flow pattern that facilitates formation of a vortex in the second gas in the bottom plenum.

The illustrative vortex generators described are provided as examples and not intended to be limitations. Vortex generators of other construction may be used in other embodiments.

The inventors have observed that the vortex generators in the upper portions 400 and 401 facilitate uniform gas flow and distribution within the plenums. Uniform gas flow may include a substantially consistent pressure, mass flow, or volume flow characteristics, or uniformity in other measurable flow characteristics. The uniform gas flow in the top and bottom plenums 104, 105 further facilitates uniform gas flow through the first and second conduits 218 and 226, respectively. Uniform gas flow in the first and second conduits 218, 226 has been observed to deliver a consistent and reliable flow of gas from the first and second nozzles 224, 232, respectively.

Figure 5:
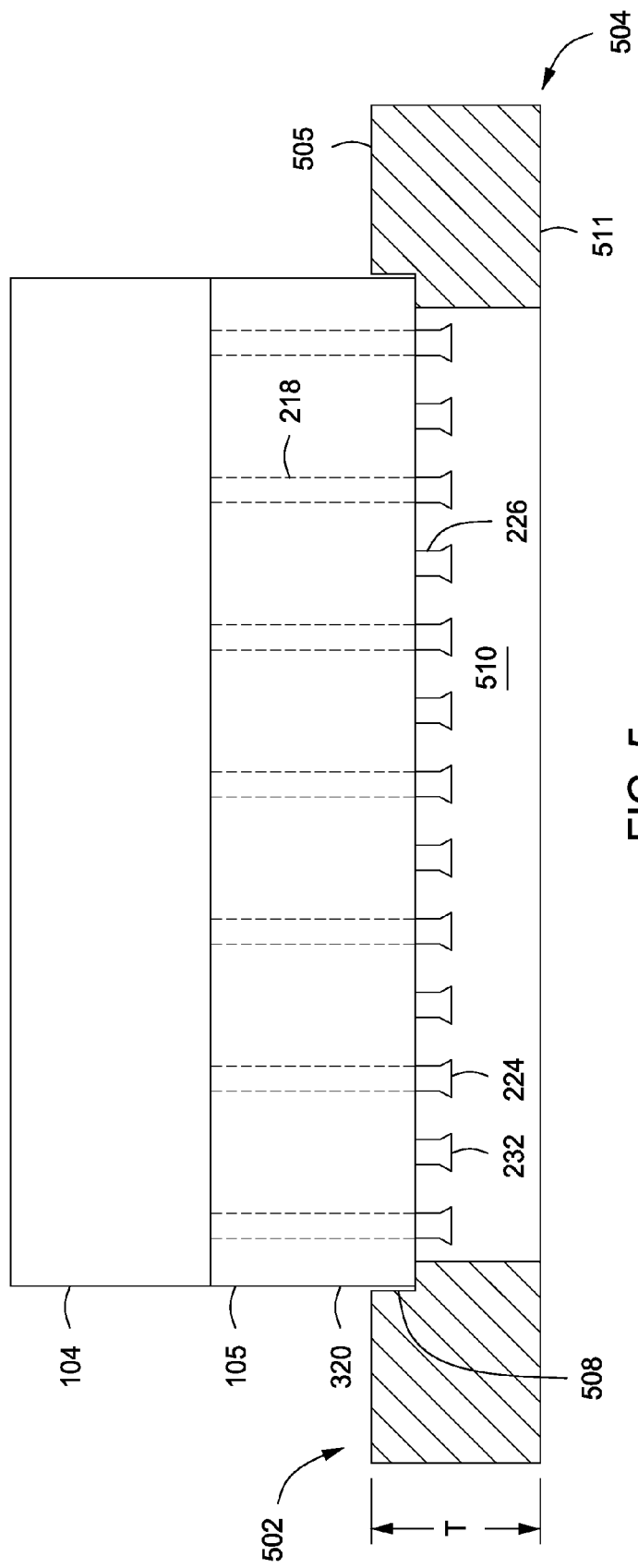
FIG. 5 depicts a cross sectional view of a gas injection apparatus according to some embodiments of the present invention.

In some embodiments, and as illustrated in FIG. 5, the gas injection apparatus 103 includes an optional injection cartridge 502 to facilitate interfacing with a process chamber in which the gas injection apparatus 103 is to be used. The cartridge 502 has an elongated body 504 with a first side 505 having an elongate channel 510 formed therethrough. In some embodiments, a flange may be disposed around an upper perimeter of the body 504, proximate the first side 505. The elongate channel 510 passes through the elongated body 504 from the first side 505 to the second side 511. Notch 508 is formed within the body 504 at an upper portion of the elongate channel 510. The notch 508 is sized to accept and align a bottom portion 320 of the gas injection apparatus 103 in an abutting arrangement. The bottom portion 320 and the notch 508 may be coupled in a gas-tight manner such that no gas, or substantially no gas, can pass between the abutting surfaces of the notch 508 and the elongate channel 510.

The elongate channel 510 is sized and shaped to accept the first and second conduits 218, 226 and the first nozzles 224 and second nozzles 232 therein. A total of 13 conduits (and associated nozzles), seven first conduits 218 and six second conduits 226 are illustrated in FIG. 5 for convenience only. A greater number or a lesser number of conduits (and associated nozzles) may be used.

The thickness T may be selected such that the first and second nozzles 224, 232, respectively, are recessed above the second side 511 as illustrated. In alternate embodiments, the first and second nozzles may be coplanar with the second side 511 or may extend beyond the second side 511.

Figure 6:
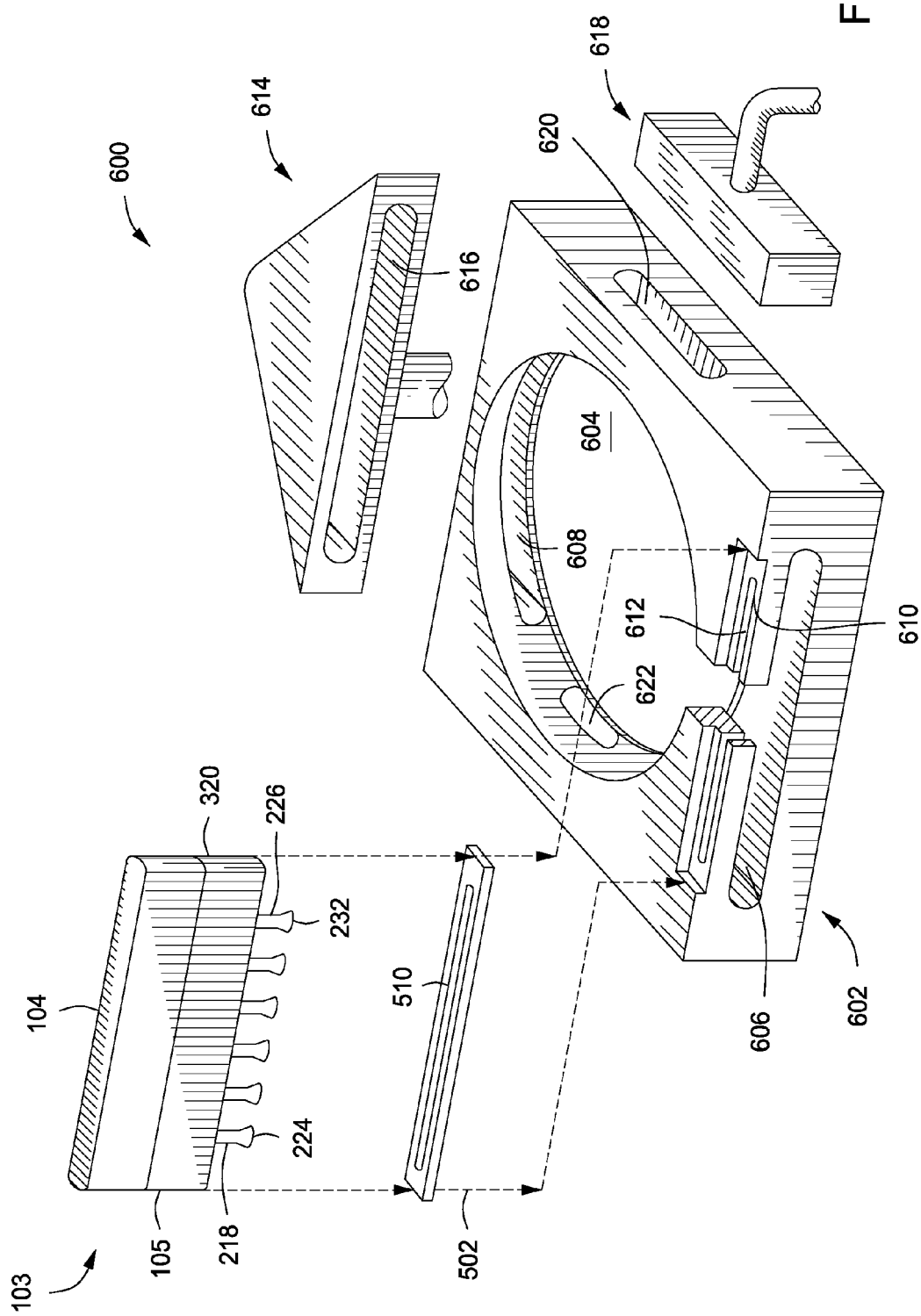
FIG. 6 is an exploded schematic view of a substrate processing apparatus according to embodiments of the present invention.

FIG. 6 is an exploded schematic view illustrative of a substrate processing apparatus 600 including a gas injection apparatus 103 and optional injection cartridge 502 according to embodiments of the invention. The substrate processing apparatus 600 shown is a rapid thermal process (RTP) apparatus, although process chambers configured for other processes may also be used. The substrate processing apparatus 600 comprises a chamber body 602 defining a cylindrical processing volume 604 configured to process a substrate therein. The chamber body 602 has an inlet port 606 and an outlet port 608 formed on opposite sides of the processing volume 604. In some embodiments, the width of the inlet port 606 and the width of the outlet port 608 are substantially similar to the diameter of the cylindrical processing volume 604 to assure uniform gas flow from the inlet port to the outlet port 608. In some embodiments, the inlet port 606 may be a substrate tunnel used to transfer, e.g., load and unload, a substrate into and out of the processing volume 604.

The substrate processing apparatus 600 further comprises an optional injection cartridge 502 coupled to the gas injection apparatus 103 as described above and indicated by the dotted lines in FIG. 6. The injection cartridge 502 is similarly coupled to the inlet port 606 such that a gas tight, or substantially gas tight seal is achieved between the gas injection apparatus 103. The injection cartridge 502 is configured to provide a gas flow from the first and second nozzles 224, 232, respectively, through the inlet port 606 and processing volume 604 to the outlet port 608. A notch 610 is formed on the chamber body 602 above the inlet port 606 and an elongated through hole 612 is formed through the bottom of the notch 610 and open to the inlet port 606. The injection cartridge 502 is configured to provide processing gases through the elongated through hole 612 to the inlet port 606 and the processing volume 604.

In embodiments not using the injection cartridge 502, the bottom portion 320 of the gas injection apparatus 103 and the notch 610 are configured to cooperatively couple in a gas tight, or substantially gas tight manner. The elongated through hole 612 is is sized and shaped to accept the first and second conduits 218, 226 and the first nozzles 224 and second nozzles 232 therein. The first and second nozzles 224, 232 may extend at least partially through the elongated through hole 612.

During processing, first and second gases are separately supplied through first and second nozzles 224, 232, respectively, fill the elongate channel 510, and exit the injection cartridge 502 to the inlet port 606 of the chamber body 602. The flow of mixed gases through the processing volume 604 may be facilitated by the action of an exhaust assembly 614.

The inventors have discovered that with the gas injection apparatus 103 of the present invention, enhanced independent flow control for each gas species is obtained. The first nozzle 224 may control the flow of the first gas from the top plenum 104 and the second nozzle 232 controls the flow of the second gas from the bottom plenum 105. The first and second conduits 218, 226 maintain the relatively cold process gases separate from each other until they are mixed in the inlet port 606 distanced from the radiant energy source 108. This has been observed to desirably move the combustion process to the processing volume 604. The inventors have noted that mixing the process gases in the inlet port 606 decreases, or eliminates, premature combustion and flashback, protecting the gas injection apparatus 103 from damage.

An exhaust assembly 614 may coupled to the chamber body 602 near the outlet port 608. The exhaust assembly 614 has an opening 616 substantially similar to the outlet port 608 to facilitate uniform flow of the mixed process gases through the processing volume 604.

The substrate processing apparatus 600 may further comprise one or more side injection assemblies 618 coupled to side ports 620 or 622 formed through the chamber body 602 into the processing volume 604. The side ports are formed between the inlet port 606 and the outlet port 608 and are configured to allow a gas flow to the processing volume 604 that is at an angle to, such as substantially perpendicular to, a direction of gas flow of the gases flowing from the gas injection apparatus to the exhaust. Side gas may be useful to improve gas distribution uniformity near the edge areas of the processing volume 604.

Thus, improved methods and apparatus for the distribution of process gases have been provided herein. Embodiments of the inventive methods and apparatus may advantageously provide for improved gas mixing and distribution for substrate processing, for example in rapid thermal processing.

While the foregoing is directed to embodiments of the present invention, other and further embodiments of the invention may be devised without departing from the basic scope thereof.

The invention claimed is:

1. A gas injection apparatus, comprising:
   an elongate top plenum comprising a first gas inlet;
   an elongate bottom plenum disposed beneath and supporting the top plenum, the bottom plenum comprising a second gas inlet;
   a plurality of first conduits disposed through the bottom plenum and having first ends fluidly coupled to the top plenum and second ends disposed beneath the bottom plenum; and
   a plurality of second conduits having first ends fluidly coupled to the bottom plenum and second ends disposed beneath the bottom plenum;
   wherein a lower end of the bottom plenum is adapted to fluidly couple the gas injection apparatus to a mixing chamber such that the second ends of the plurality of first conduits and the second ends of the plurality of second conduits are in fluid communication with the mixing chamber; and
   wherein at least one of the top plenum or the bottom plenum comprises a vortex generator, wherein the vortex generator comprises a constricted volume area in the plenum in fluid communication with an interior volume of the plenum, and a gas inlet into the constricted volume area.

2. The gas injection apparatus of claim 1, wherein the second ends of the plurality of first conduits and the second ends of the plurality of second conduits are disposed below a lower end of the bottom plenum.

3. The gas injection apparatus of claim 1, wherein the first conduits and the second conduits are arranged in an alternating pattern at the lower end of the bottom plenum.

4. The gas injection apparatus of claim 1, wherein the second ends of at least one of the first conduits or the second conduits include a nozzle.

5. The gas injection apparatus of claim 1, wherein the first conduits terminate at first nozzles and the second conduits terminate at second nozzles.

6. The gas injection apparatus of claim 1, wherein a first gas source is fluidly coupled to a first end of the top plenum and to a second end of the top plenum.

7. The gas injection apparatus of claim 1, wherein a second gas source is fluidly coupled to a first end of the bottom plenum and to a second end of the bottom plenum.

8. The gas injection apparatus of claim 1, further comprising:
   a cartridge comprising an elongated body and a channel formed therethrough wherein a lower end of the bottom plenum is coupled to the cartridge such that second ends of the plurality of first conduits and second ends of the plurality of second conduits are in fluid communication with the channel.

9. A gas injection apparatus, comprising:
   an elongate top plenum having a vortex generator and a pair of opposing first gas inlets, wherein the vortex generator comprises a constricted volume area in an upper portion of the top plenum, and wherein the opposing first gas inlets are disposed in upper portions of opposing sides of the top plenum within the constricted volume area;
   an elongate bottom plenum disposed beneath and supporting the top plenum, the elongate bottom plenum having a vortex generator and a pair of opposing second gas inlets, wherein the vortex generator comprises a constricted volume area in an upper portion of the bottom plenum, and wherein the opposing second gas inlets are disposed in upper portions of opposing sides of the bottom plenum within the constricted volume area;
   a plurality of first conduits disposed through the bottom plenum and having first ends fluidly coupled to the top plenum and second ends disposed beneath the bottom plenum; and
   a plurality of second conduits having first ends fluidly coupled to the bottom plenum and second ends disposed beneath the bottom plenum.

10. A substrate processing apparatus, comprising:
    a chamber body having an inner volume and a substrate tunnel to facilitate transfer of a substrate into and out of the inner volume, wherein the gas injection apparatus of claim 1 is coupled to the chamber body adjacent to the substrate tunnel such that the mixing chamber of the gas injection apparatus is the substrate tunnel.

11. The substrate processing apparatus of claim 10, wherein the substrate processing apparatus is a rapid thermal process apparatus.

12. The substrate processing apparatus of claim 10, wherein the chamber body further comprises a substrate support disposed in the inner volume, and wherein the gas injection apparatus and an exhaust assembly of the chamber body facilitate flow of a gas across a substrate support surface of the substrate support.

13. The substrate processing apparatus of claim 10, wherein the chamber body further comprises a substrate support disposed in the inner volume, and wherein the gas injection apparatus has a width approximate a diameter of the substrate support.

14. The substrate processing apparatus of claim 10, wherein the first conduits and second conduits are configured to respectively supply a first gas and a second gas to the inner volume.

15. The substrate processing apparatus of claim 10, further comprising a side injection assembly coupled to a side port formed through the chamber body.

16. The substrate processing apparatus of claim 15, wherein the side injection assembly provides one or more process gases in a direction substantially perpendicular to a direction of gas flow provided by the gas injection apparatus.

17. The substrate processing apparatus of claim 10, further comprising:
    a first gas source coupled to the first gas inlet; and
    a second gas source coupled to the second gas inlet.

18. The substrate processing apparatus of claim 17, wherein the first gas source provides one of an oxygen gas ($O_2$) or a hydrogen gas ($H_2$), and wherein the second gas source provides the other of the oxygen gas ($O_2$) or the hydrogen gas ($H_2$).

* * * * *